United States Patent
Adams et al.

(10) Patent No.: US 8,754,691 B2
(45) Date of Patent: Jun. 17, 2014

(54) MEMORY ARRAY PULSE WIDTH CONTROL

(71) Applicant: International Business Machines Corporation, Armonk, NY (US)

(72) Inventors: Chad A. Adams, Byron, MN (US); Derick G. Behrends, Rochester, MN (US); Travis R. Hebig, Rochester, MN (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 13/760,378

(22) Filed: Feb. 6, 2013

(65) Prior Publication Data

US 2014/0084980 A1 Mar. 27, 2014

Related U.S. Application Data

(63) Continuation of application No. 13/629,208, filed on Sep. 27, 2012, now abandoned.

(51) Int. Cl.
  *H03K 3/017* (2006.01)
(52) U.S. Cl.
  USPC .................. 327/172; 327/36; 327/175
(58) Field of Classification Search
  USPC .................. 327/170, 172–176, 35–37
  See application file for complete search history.

(56) References Cited

U.S. PATENT DOCUMENTS

| | | | |
|---|---|---|---|
| 5,912,593 A * | 6/1999 | Susak et al. | ......... 331/111 |
| 7,002,857 B2 | 2/2006 | Kang | |
| 7,260,010 B2 | 8/2007 | Kwak et al. | |
| 7,668,037 B2 | 2/2010 | Carpenter et al. | |
| 7,786,777 B2 | 8/2010 | Denier | |
| 7,869,302 B2 | 1/2011 | Joshi et al. | |
| 7,936,638 B2 | 5/2011 | Chan et al. | |
| 8,139,438 B2 | 3/2012 | Hara | |
| 8,149,645 B2 | 4/2012 | Anvar et al. | |
| 2005/0040880 A1 | 2/2005 | Plojhar et al. | |
| 2010/0246311 A1 | 9/2010 | Tao et al. | |
| 2011/0199844 A1 | 8/2011 | Miki et al. | |
| 2011/0234132 A1 | 9/2011 | Norell | |

OTHER PUBLICATIONS

Anonymous, Disclosed by IBM, "Servocontrol Circuit for Generation of Variable Clock Frequencies Using an All Digital Frequency Locked Loop", Published by IP.com Prior Art Database, IP.com No. IPCOM000190348D, Published Nov. 24, 2009. http://www.ip.com/pubview/IPCOM/000190348D.
Anonymous, "Pulsed Local Clock Buffer with Independent back edge shaping", Published by IP.com Prior Art Database, IP.com No. IPCOM000211371D, Published Sep. 29, 2011. http://www.ip.com/pubview/IPCOM/000211371D.

* cited by examiner

*Primary Examiner* — An Luu
(74) *Attorney, Agent, or Firm* — Chad J. Hammerlind; Robert R. Williams

(57) ABSTRACT

A clock system includes a local clock buffer adapted to receive a variable global clock signal. The local clock buffer produces a first local clock signal from the variable global clock signal. The clock system includes a pulse width logic control circuit in operable communication with the local clock buffer. The pulse width logic control circuit may be adapted to limit the first local clock signal pulse width to be less than the variable global clock signal pulse width during a slow mode. The pulse width logic control circuit may be adapted to expand the first local clock signal pulse width to be greater than the variable global clock signal pulse width during a fast mode. The limited and expanded first local clock signals may signal a local evaluation circuit to address a memory line.

19 Claims, 9 Drawing Sheets

MEMORY ARRAY PULSE WIDTH CONTROL

CROSS-REFERENCE TO RELATED APPLICATIONS

This application is a continuation of co-pending U.S. patent application Ser. No. 13/629,208, filed Sep. 27, 2012. The aforementioned related patent application is herein incorporated by reference in its entirety.

FIELD

The present invention relates generally to memory arrays, and more particularly to controlling evaluation circuit signal pulse widths in memory arrays.

BACKGROUND

Static Random Access Memory (SRAM) is a type of semiconductor memory. A memory array may be made up of SRAM cells, each cell capable of storing a bit of memory. An SRAM cell may be made up of several transistors. In the traditional SRAM cell, the SRAM cell is made up of six transistors. Four transistors form two crossed-coupled inverters for storing a bit of data. The other two transistors act as access transistors in allowing one or more bitlines to access the cross-coupled inverters. Turning off and on the access transistors may be controlled by a wordline connected to the gates of the access transistors.

SUMMARY

In one embodiment, a clock system is disclosed. The clock system includes a local clock buffer adapted to receive a variable global clock signal. The local clock buffer produces a first local clock signal from the variable global clock signal. The clock system further includes a pulse width logic control circuit in operable communication with the local clock buffer. The pulse width logic control circuit may be adapted to limit the first local clock signal pulse width to be less than the variable global clock signal pulse width during a slow mode. Furthermore, the pulse width logic control circuit may be adapted to expand the first local clock signal pulse width to be greater than the variable global clock signal pulse width during a fast mode. The limited and expanded first local clock signals may signal a local evaluation circuit to address a memory line.

In another embodiment, a method is described. The method includes the steps of monitoring a variable global clock signal pulse width. The method further includes the step of determining whether the variable global clock signal pulse width is within a local evaluation signal pulse width threshold. Also, the method includes adjusting the variable global clock signal pulse width to be within the local evaluation signal pulse width threshold if the variable global clock signal pulse width is not within the local evaluation signal pulse width threshold.

In yet another embodiment, a design structure is described. The design structure describes the clocks system summarized above.

BRIEF DESCRIPTION OF THE DRAWINGS

In the drawings and the Detailed Description, like numbers generally refer to like components, parts, steps, and processes.

DETAILED DESCRIPTION

For performance reasons, high speed memory arrays such as, but not limited to, Static Random Access Memory (SRAM) arrays often use short full-swing bitlines connected to local evaluation circuits. A full-swing bitline may use the entire range of possible voltages on the bitline to signal a high and low state, e.g. the voltage of the bitline may range from the supply voltage Vdd to ground. The local evaluation circuits perform a single ended read of the bitline. Bitlines are precharged with a logical '1'. The bitline going low signals a logical '0' has been read. The bitline remaining high signals that a logical '1' has been read. Requiring a precharge, subjects bitlines to leakage issues meaning the precharge on the bitline may lose charge over time where the voltage on the bitline falls below a threshold voltage. In addition, there are no keeper devices, which may be small transistors that supply charge to the bitline to make up for leakage, to support a precharge on the bitlines to prevent leakage.

In these memory arrays, an evaluation signal pulse width in the local evaluation circuits and other dynamic circuits is important to control because of the leakage from the SRAM on the bitlines. However, the evaluation signal pulse width not only needs to be narrow enough to avoid bitline leakage at slow processes but the evaluation signal pulse width needs to be wide enough to allow for a read at fast processes. Large memory arrays with significant RC delays may also fail to operate at fast processes due to a narrow evaluation signal pulse width. Maintaining proper margins for both constraints across different process corners is challenging.

A situation where evaluation signal pulse width issues in memory arrays may arise is where system chips run at different frequencies when different modes of the system are being used. For example, a gaming system may have a full speed mode for gaming at 6 GHz and a DVD mode for playing back DVDs at 2 GHz. If the duty cycle for dynamic circuits within the memory array follows the global clock, there may be leakage problems in the 2 GHz mode or improper reads at the 6 GHz mode.

Figure 1:
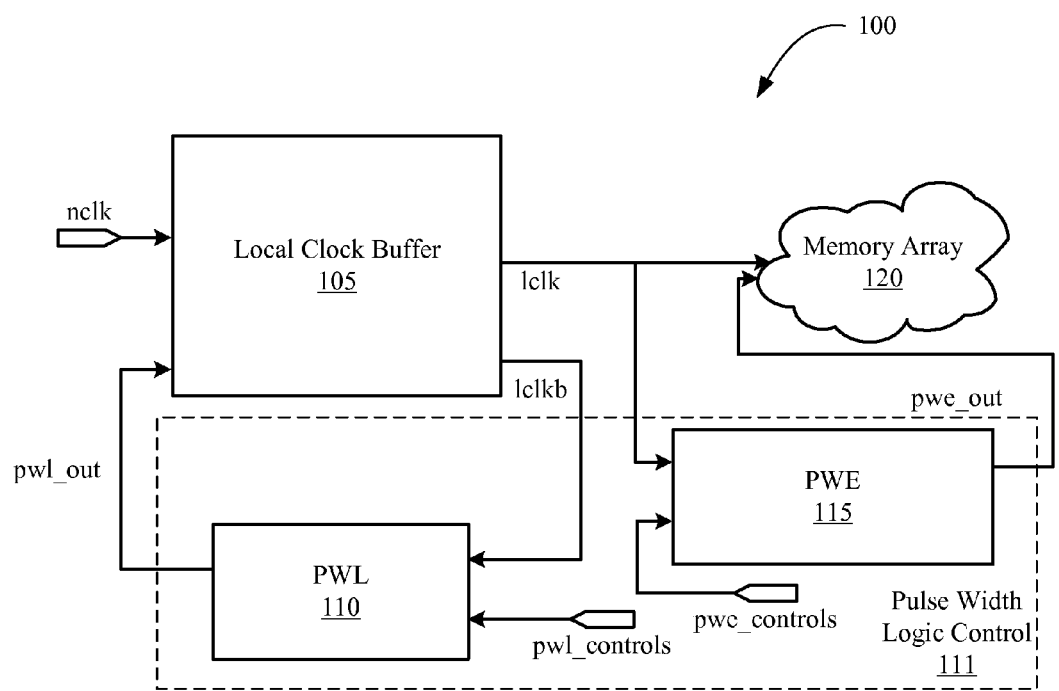
FIG. 1 is a high-level block diagram of a clock system, according to an embodiment.

FIG. 1 is a high-level block diagram of a clock system 100, according to an embodiment. The clock system 100 may adjust a variable global clock signal nclk to create an evaluation signal with the proper pulse width during the evaluate phase of a memory line. The global clock is variable because it may have different modes where the global clock has different pulse widths such as a fast clock or a slow clock. A fast clock may have a short pulse width that may cause a local evaluation circuit to misread a memory line due to not having enough time to evaluate it. A slow clock signal may have a wide pulse width that may cause the local evaluation circuit of a memory array memory line, such as a bitline to inaccurately read a logical "0" instead of a logical "1" due to memory line leakage. The local clock system 100 may include a local clock buffer 105, a pulse width logic control circuit 111, and a memory array 120. The pulse width logic control circuit 111 may include a pulse width limiting (PWL) circuit 110 and a pulse width expansion (PWE) circuit 115. The memory array 120 may be, but not limited to, the SRAM array that may include the bitlines and wordlines for reading and writing the 1s and 0s stored on the individual SRAM cells.

The pulse width logic control circuit 111 may be in operable communication with the local clock buffer 105. The pulse width logic control circuit may be adapted to limit a first local clock signal pulse width lclk to be less than a variable global clock signal nclk pulse width during the slow mode. The pulse width logic control circuit 111 may also be adapted to expand the first local clock signal lclk pulse width to be greater than the variable global clock signal nclk pulse width during the fast mode. The limited and expanded first local clock signals may signal a local evaluation circuit to evaluate a memory line within the memory array 120.

The local clock buffer 105 may receive the global clock signal nclk. The local clock buffer 105 may derive the first local clock signal lclk, and a second local clock signal lclkb that may be an inversion of lclk. The lclk may control the timing of the evaluation signal pulse width for a local evaluation circuit in the memory array 120. Also, lclk and lclkb may provide signals to the PWE circuit 115 and the PWL circuit 110, respectively.

The local clock buffer 105 may also receive a pulse width limitation signal pwl_out from the PWL circuit 110. The PWL circuit 110 may receive the lclkb signal from the local clock buffer as shown in FIG. 1. The PWL circuit 110 may limit the pulse widths of the output signals of the local clock buffer 105, lclk and lclkb, so that the signals are not as wide as the pulse width of the nclk in a slow nclk clock mode. In a fast nclk situation, the PWL circuit 110 may not limit the outputs of the local clock buffer 105. In a fast clock situation, the outputs of the local clock buffer 105 may follow the nclk signal. PWL circuit 110 may also receive PWL control signals pwl_controls. The pwl_controls may be used to vary the pulse width of pwl_out from the PWL circuit 110.

The pulse width expansion circuit, PWE 115, may receive the lclk signal from the local clock buffer 105 and may derive a pulse width expansion signal pwe_out to the memory array 120. The PWE circuit 115 may extend the lclk signal so the pwe_out signal has a wider pulse width than the lclk signal. PWE 115 may also receive PWE control signals pwe_controls. The pwe_controls may allow for variation of the pulse width of the pwe_out signal.

In a slow mode situation, the PWL circuit 110 may limit the nclk pulse width by deriving pwl_out to be shorter than the nclk pulse width. The pwl_out may control the clock of the local clock buffer, which will produce an lclk and lclkb with a shorter pulse width than nclk. The lclk may signal the PWE circuit 115. The PWE circuit 115 may expand the lclk signal to derive pwe_out, which may have a greater pulse width than lclk but pwe_out may have a shorter pulse width than nclk. It may be noted that pulse width refers to the length of time a logic state of a signal is asserted. The evaluation signal pulse width may be derived by the lclk and pwe_out signal in the memory array 120.

Figure 5:
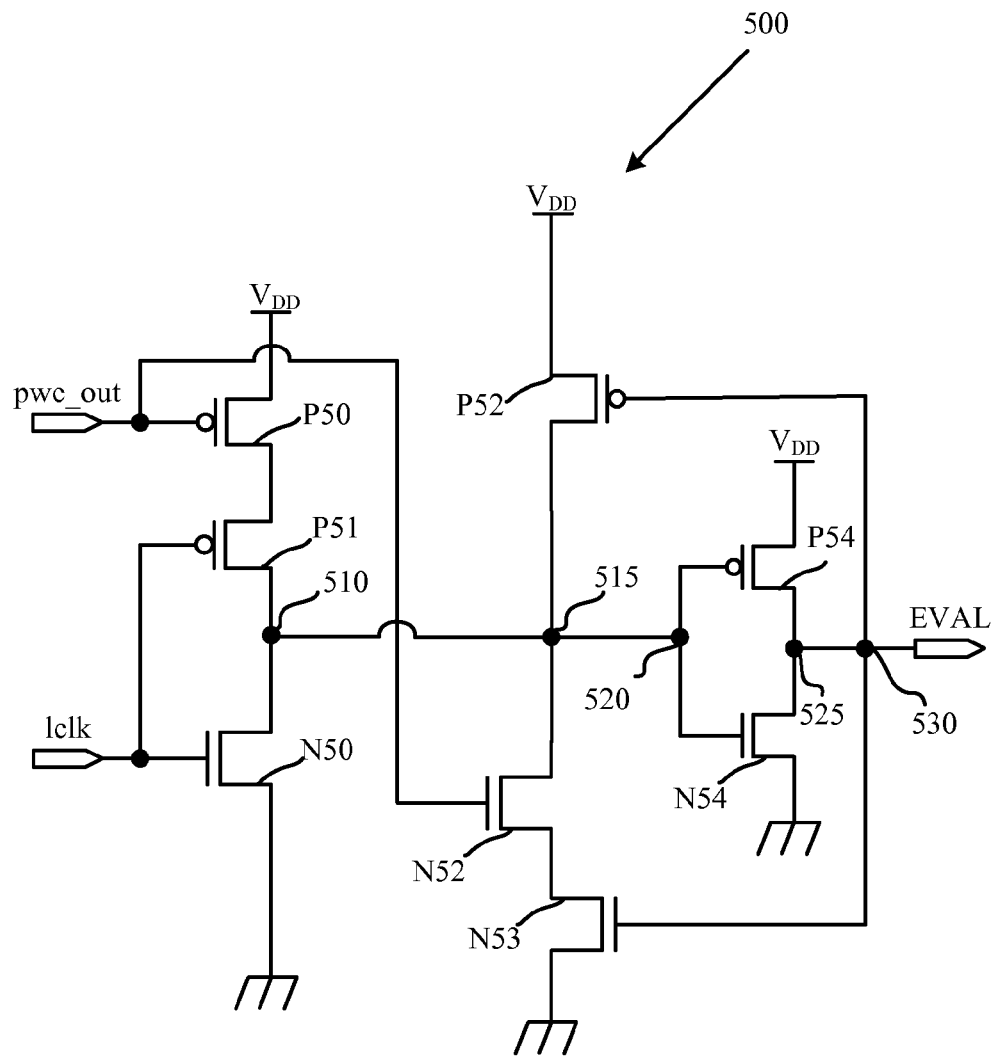
FIG. 5 is a circuit diagram of a memory array timing circuit in a memory array of FIG. 1, according to an embodiment.

An array timing circuit 500, illustrated in FIG. 5, of the memory array 120 may be the circuit to receive the lclk signal from the local clock buffer 105 along with the pwe_out signal from the PWE circuit 115. The array timing circuit 500 may derive the evaluation signal EVAL from the lclk and the pwe_out signals. The evaluation signal EVAL may fall within a local evaluation signal pulse width threshold where the local evaluation signal pulse width threshold has a pulse width that allows for proper reads and writes of memory lines such as wordlines and bitlines. While the illustrative embodiment depicted in FIG. 1 is specifically directed to a memory array 120, it is understood that the techniques, according to aspects of the disclosure, apply to other types of storage arrays in which timing margins of bitline evaluation circuits are of importance.

Figure 2:
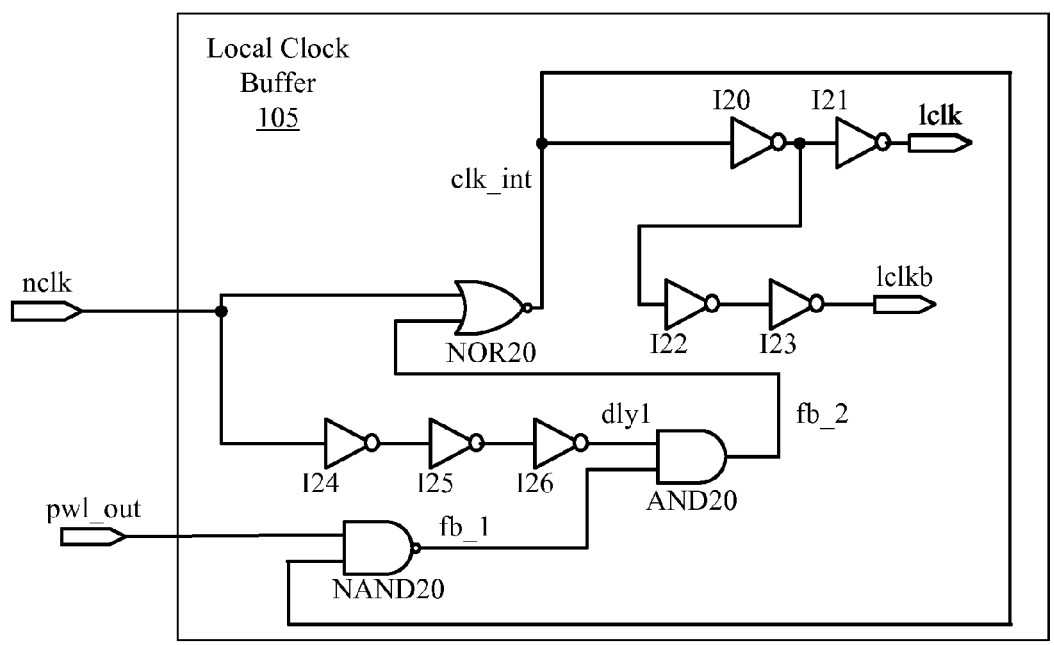
FIG. 2 is a circuit diagram of an exemplary local clock buffer of FIG. 1, according to an embodiment.

According to an embodiment, FIG. 2 is an exemplary schematic diagram of the local clock buffer 105 of FIG. 1. The local clock buffer 105 may receive the global clock signal nclk and the pulse width limiting signal pwl_out. The local clock buffer 105 may derive the local clock signals lclk and lclkb signals. The local clock buffer may adjust the nclk pulse width depending on the speed of the variable global clock nclk. In a fast nclk situation, the local clock buffer 105 may derive the local clock signals to have a pulse width derived from nclk. In a slow nclk situation, the local clock buffer may derive the limited local clock signals with a less pulse width than nclk through the PWL circuit 110 by deriving the limited local clock signals with pwl_out. In an exemplary embodiment of the local clock buffer 105, nclk may signal a first input of logical NOR gate NOR20. A second input of logical NOR gate NOR20 may be signaled by a second feedback signal fb_2. NOR20 may derive a clock signal clk_int. The clk_int may signal an inverter I20, which may signal inverters I21 and I22. I21 may derive lclk and I22 may signal another inverter I23, which may derive an inverted lclk signal, lclkb.

The clk_int may also signal a first input of logical NAND gate NAND20. The pwl_out may signal a second input of logical NAND gate NAND20. NAND20 may derive a feedback signal fb_1. The fb_1 may signal a first input of logical AND gate AND20. The nclk may also signal a series of delay inverters I24, I25, and I26, which may provide an inverted nclk or first delay signal dly1 to a second input of logical AND gate AND20. AND20 may derive fb_2 to signal NOR20. NOR20 may control clk_int and therefore, may control the local clock buffer 105 derived local clock signals lclk and lclkb. Thus, clk_int is either derived from the nclk signal during a fast nclk or clk_int is derived from pwl_out during a slow nclk.

Figure 3:
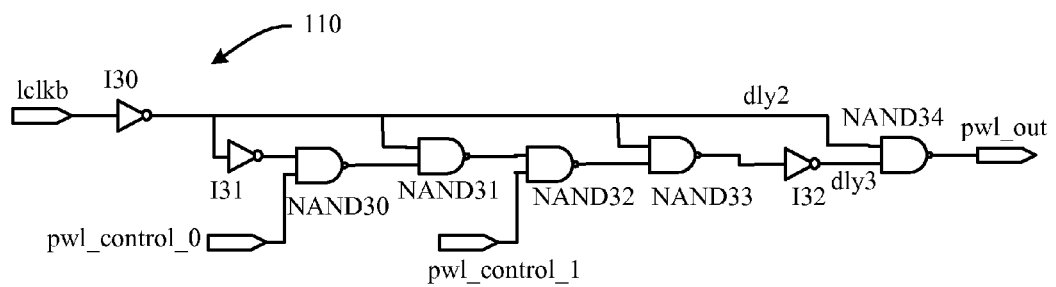
FIG. 3 is a circuit diagram of an exemplary pulse width limiting circuit of FIG. 1, according to an embodiment.

FIG. 3 illustrates an exemplary embodiment of the PWL circuit 110. The pulse width limiting circuit 110 may limit the pulse width of the local clock signals lclk and lclkb during a slow nclk mode. Lessening the width of the pulse widths makes the local clock signal faster. PWL circuit 110 may receive lclkb signal from the local clock buffer 105. In an exemplary embodiment of the PWL circuit 110, the lclkb signal may be inverted by inverter I30. The signal derived by I30 may be a second delay signal dly2. The dly2 may signal a first input of logical NAND gate NAND 34. The dly2 may also signal delay circuitry such as inverter I31 and a first input of logical NAND gates NAND31 and NAND 33. The signal derived by I31 may signal a first input of logical NAND gate NAND30. A second input of NAND30 may be signaled by a first PWL delay control signal pwl_control_0. The signal derived by NAND30 may signal a second input of NAND31. The signal derived by NAND31 may signal a first input of logical NAND gate NAND32. A second input of NAND32 may be signaled by a second PWL delay control signal pwl_control_1. The signal derived by NAND 32 may signal a second input of NAND33. The signal derived from NAND33 may signal an inverter I32. The signal derived by I32 may be a third delay signal dly3. The dly3 may signal a second input of NAND34. The signal derived by NAND34 may be the pulse width limiting output signal pwl_out, which may signal the local clock buffer 105 of FIG. 1 and FIG. 2. The pwl_control_0 and pwl_control_1 signals may be used to vary the pulse width of pwl_out if the memory array 120 needs a different pulse width limitation, for example a user may use pwl_control_0 and pwl_control_1 by means of signal pairs or latches to alter pulse width of pwl_out.

Figure 4:
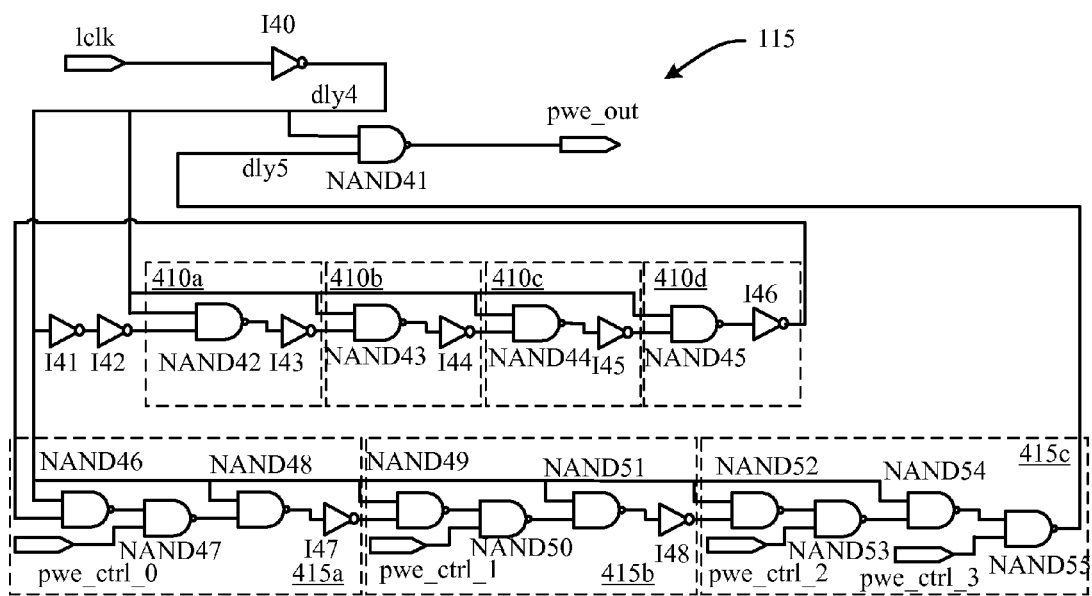
FIG. 4 is a circuit diagram of an exemplary pulse width expansion circuit of FIG. 1, according to an embodiment.

Referring now to FIG. 4, details of an exemplary PWE circuit 115 are shown, in accordance with an embodiment. PWE circuit 115 may expand the lclk signal into pwe_out signal. The PWE circuit 115 may expand lclk so pwe_out has a wider pulse phase than the nclk signal does in fast mode. In slow mode, the expansion of the lclk signal may not be as wide as the width of the nclk pulse width. The expansion of lclk may be done through a series of delay circuits within the PWE circuit 115. In one embodiment, during a slow mode, PWE circuit 115 may not expand the lclk signal and the memory array 120 may be signaled by on the limited lclk signal derived from the pwl_out signal.

In an exemplary PWE circuit 115, PWE circuit 115 may receive signal lclk. The lclk may be inverted by inverter I40. The signal derived by I40 may be a fourth delay signal dly4. The dly4 may signal a first input of logical NAND gate NAND 41. The dly4 may also signal inverter I41 and delay circuits 410a, 410b, 410c, 410d, 415a, 415b, and 415c. Inverter I42 may receive a derived signal from I41. The derived signal by I42 may signal a first delay circuit 410a. Second, third, and fourth delay circuits 410b, 410c, and 410d may include the same circuitry as first delay circuit 410a. The delay circuits 410a, 410b, 410c, and 410d may include a logical NAND gate that has a first input signaled by dly4 and a second input signaled by I42 in the first delay circuit 410a or the derived signal of the previous delay circuit, e.g. output of delay circuit 410a signals second input of logical NAND gate NAND43 of second delay circuit 410b. The derived signal of the logical NAND gates of the delay circuits 410a, 410b, 410c, and 410d may be inverted by an inverter, which derives the output of the delay circuits 410a, 410b, 410c, and 410d. Fourth delay circuit 410d may derive a signal that signals a fifth delay circuit 415a.

The fourth delay circuit 410d may signal a second input of logical NAND gate NAND46 of the fifth delay circuit 415a. A first input of NAND46 may be signaled by dly4. The derived signal of NAND46 may signal a first input of NAND47. A first PWE control signal pwe_ctrl_0 may signal a second input of NAND47. The signal derived by NAND47 may signal a second input of NAND48. The dly4 may signal a first input of NAND48. The derived signal from NAND48 may signal an inverter I47. The logic gates NAND46, NAND47, NAND48 and I47 may make up a fifth delay circuit 415a. A sixth delay circuit 415b may have the same logic configuration as the fifth delay circuit 415a. The sixth delay circuit 415b may receive a signal derived from I47. The sixth delay circuit 415b may contain NAND49, NAND50 receiving a second PWE control signal pwe_ctrl_1, NAND51, and I48. The signal derived by I48 may signal a seventh delay circuit 415c. Seventh delay circuit 415c may be the same logical configuration as the fifth and sixth delay circuits 415a and 415b except the seventh delay circuit 415c may have a logical NAND gate NAND55 in place of an inverter such as inverters I47 and I48. The seventh delay circuit includes NAND52, NAND53 receiving a third PWE control signal pwe_ctrl_2, and NAND54. The derived signal by NAND54 signals a first input of NAND55. A fourth PWE control signal pwe_ctrl_3 signals a second input of NAND55. The derived signal of NAND55 may be a fifth delay signal dly5. The dly5 may signal a second input of NAND41. The derived signal of NAND41 may signal the PWE signal pwe_out.

Referring now to FIG. 5, a memory array timing circuit 500 of memory array 120 is shown according to one embodiment. The memory array timing circuit 500 may receive the pwe_out and lclk. The memory array timing circuit 500 may derive an evaluation signal EVAL. The EVAL signal may signal a local evaluation circuit for a bitline of the memory array 120 for proper read and write functions during variable global clock speeds.

The pwe_out may signal the memory array timing circuit 500 at a gate input of p-type field effect transistor (PFET) P50 and a gate input of n-type field effect transistor (NFET) N52. P50 may have a source node coupled to a first supply voltage, such as Vdd, and a drain coupled to a source node of PFET P51. The gate input of P51 may be signaled by lclk and the drain node of P51 may be coupled to a node 510. Node 510 may also be coupled with node 515 and a drain node of NFET N50. The lclk may signal a gate input of N50 and a source node of N50 may be coupled to a second supply voltage, such as ground.

Node 515 may be coupled to a drain node of PFET P52 and a drain node of NFET N52. Node 515 may also be coupled to node 520. Node 520 may be coupled to gate inputs of PFET P54 and NFET N54. A source node of P54 may be coupled to the first supply voltage and a drain node of P54 may be coupled to a node 525. A drain node of N54 may be coupled to the node 525 and a source node of N54 may be coupled to the second supply voltage. Node 525 may be coupled with node 530. Node 530 may derive the signal EVAL and may be coupled to a gate input of PFET P52 and a gate input of NFET N53. A drain node of N53 may be coupled to a source node of N52. A source node of N53 may be coupled with the second supply voltage. A source node of P52 may be coupled to the first supply voltage while the drain node of P52 may be coupled to node 515.

For memory array 120, a wordline may be driven tracking the EVAL signal of the bitlines. In one embodiment, the memory array timing circuit 500 may be adapted to drive a wordline. The wordline memory array timing circuit may be identical to the memory array timing circuit 500 except that there is an additional NFET in series with N50 where the drain of the additional NFET is coupled to the source of N50. The gate input of the additional NFET may receive a DECODE signal or data signal that signals the wordline memory array timing circuit to drive a wordline. The wordline memory array timing circuit may also signal WL instead of EVAL.

Figure 6:
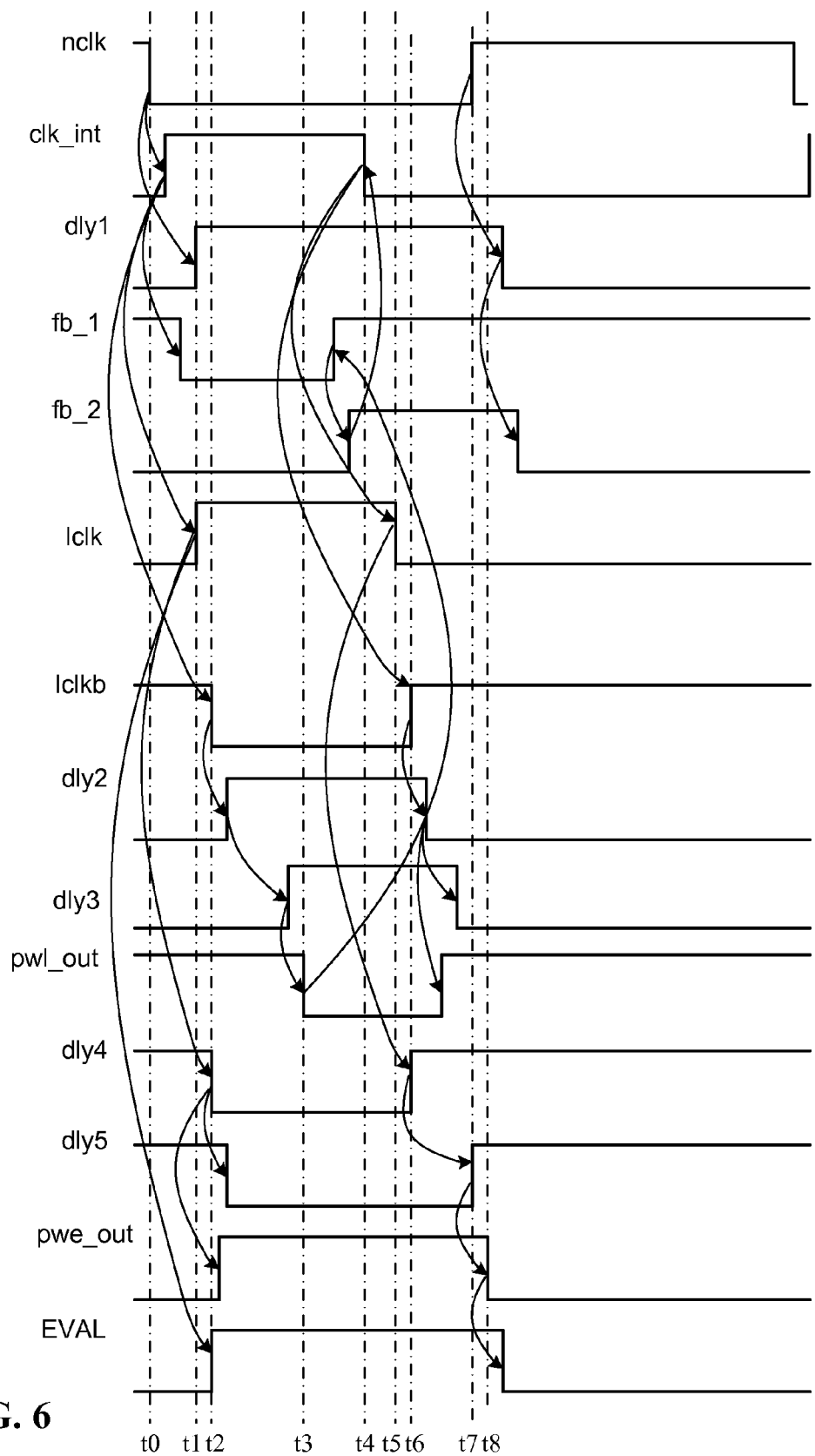
FIG. 6 is a wave diagram of the signals of the clock system during a slow clock speed, according to an embodiment.

Referring now to FIG. 6, a signal timing diagram of the clock system 100 during a slow global clock nclk is illustrated, according to one embodiment. At the initial time t0, nclk begins a slow clock cycle when asserted. The nclk may be asserted when nclk transitions from high to low. The asserted nclk may signal clk_int to assert by transitioning clk_int from low to high. The asserted nclk, after going through the delay inverters I24, I25, and I26 of FIG. 2, may assert dly1 by transitioning dly1 from low to high. Once clk_int is asserted, clk_int may signal fb_1 and lclkb to assert by transitioning them from high to low. The clk_int also may signal lclk to assert by transitioning lclk from low to high.

At time t1, the transition of lclk from high to low may signal dly4 (FIG. 4), of the PWE circuit 115, to assert by transitioning dly4 from high to low. The transition of dly4 from high to low may signal dly5 and pwe_out, also of PWE circuit 115, to assert by transitioning dly5 and pwe_out from high to low and low to high, respectively. The assertion of lclk, at t1, also may signal EVAL of the memory array 120 to assert by transitioning EVAL from low to high (FIG. 5).

At time t2, the assertion of lclkb from low to high may signal dly2 (FIG. 3) of the PWL circuit 110 to assert by transitioning dly2 from high to low. After propagating through the delay circuitry of the PWL circuit 110, dly2 may signal dly3 to assert by transitioning dly3 from low to high. The transition of dly3 from low to high may signal the pulse width limiting signal pwl_out to assert by transitioning pwl_out from high to low at time t3. The transition of pwl_out from high to low may signal fb_1 to assert by transitioning fb_1 from low to high, which in turn may signal a second feedback signal fb_2 to assert by transitioning fb_2 from low to high.

At time t4, the transition of fb_2 from low to high may signal clk_int to de-assert by transitioning clk_int from high to low. The de-assertion of clk_int may signal lclk to de-assert by transitioning lclk from high to low. The de-assertion of clk_int may signal lclkb to de-assert by transitioning lclkb from low to high.

At time t5, the de-assertion of lclk may signal dly4 to de-assert by transitioning dly4 from low to high. The de-assertion of dly4 may propagate through the delay circuitry of the PWE circuit 115 (FIG. 4) and may signal dly5 to de-assert by transitioning dly5 from low to high. The de-assertion of dly5 may signal the pulse width expansion signal pwe_out to de-assert by transitioning pwe_out from high to low.

At time t6, the de-assertion of lclkb may signal dly2 to de-assert by transitioning dly2 from high to low (FIG. 3). The de-assertion of dly2 may signal pwl_out to de-assert by transitioning pwl_out from low to high. The de-assertion of dly2 may also signal dly3 to de-assert by transitioning dly3 from high to low.

At time t7, the second half of the global clock cycle may begin when nclk de-asserts by transitioning from low to high. The de-assertion of nclk may signal dly1 to de-assert by causing dly1 to transition from high to low. The de-assertion for dly1 may signal fb_2 to de-assert by transitioning fb_2 from high to low.

At time t8, the de-assertion of pwe_out may signal EVAL to de-assert by transitioning EVAL from high to low.

Figure 7:
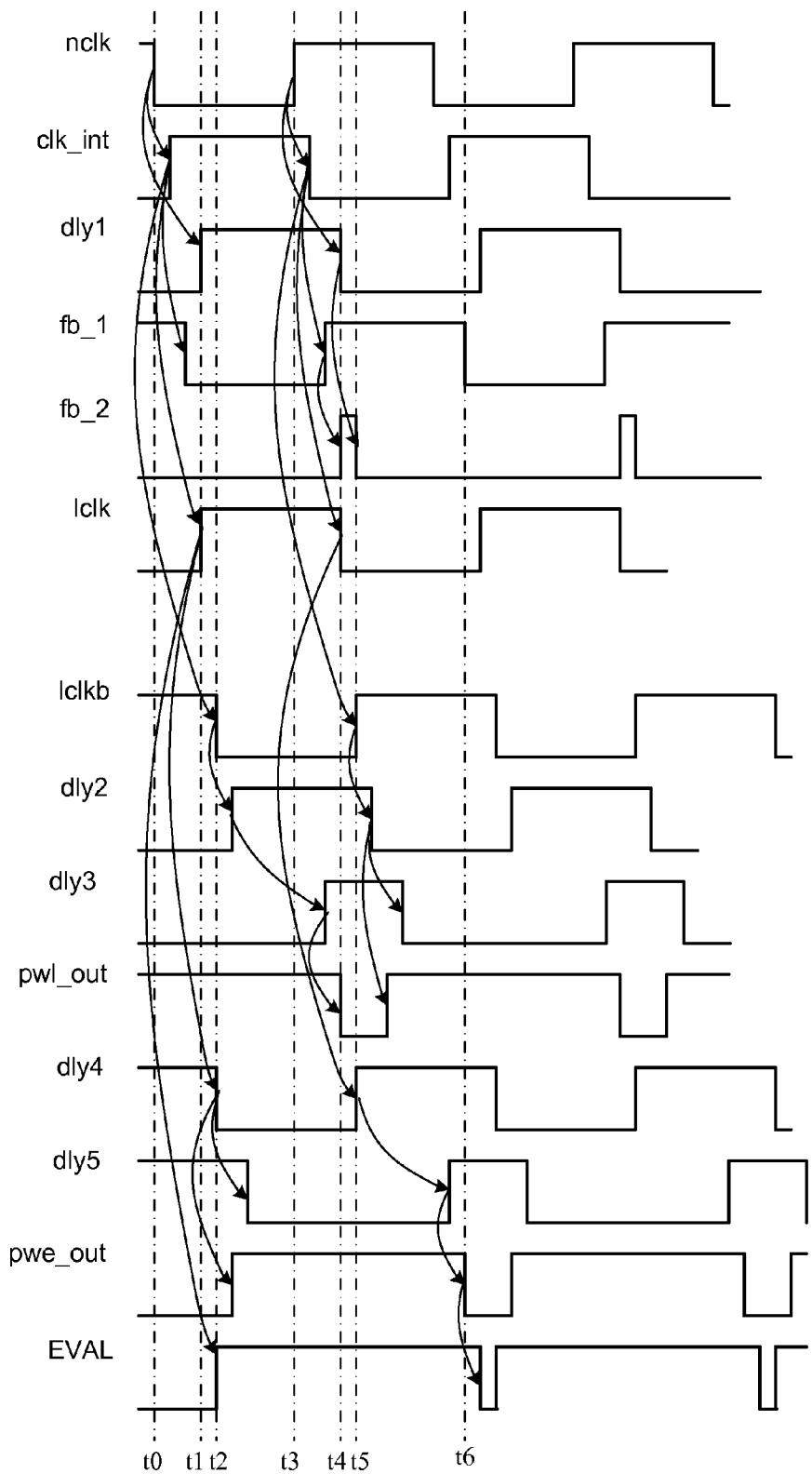
FIG. 7 is a wave diagram of the signals of the clock system during a fast clock speed, according to an embodiment.

Referring now to FIG. 7, a signal timing diagram of the clock system 100 during a fast global clock nclk is illustrated, according to one embodiment. At the initial time t0, nclk may be asserted by transitioning nclk from high to low. The assertion of nclk may signal the first delay signal dly1 to assert by transitioning dly1 from low to high (FIG. 2). The assertion of nclk low may also signal clk_int to assert by transitioning clk_int from low to high. The assertion of clk_int may assert fb_1, lclk, and lclkb. The lclk is asserted by transitioning lclk low to high. The fb_1 and lclkb may be asserted by transitioning them from high to low.

At time t1, the assertion of lclk high may signal the assertion of EVAL by transitioning EVAL from low to high (FIG. 5). The assertion of lclk may also signal the fourth delay signal dly4 of PWE circuit 115 to assert (FIG. 4). The assertion of dly4 may transition dly4 from high to low. The assertion of dly4 may signal the fifth delay signal dly5 to assert by transitioning dly5 from high to low after a short delay. The assertion of dly4 low may also signal the assertion of pwe_out by transitioning pwe_out from low to high.

At time t2, the assertion of lclkb low may signal the second delay signal dly2 of the pulse width limiting circuit 110 to be asserted by transitioning dly2 from low to high (FIG. 3). The transition of dly2 high may signal the third delay signal dly3 to assert by transitioning dly3 from low to high after dly2 propagates through the delay circuitry of PWL circuit 110. The assertion of dly3 high may signal pwl_out to assert by transitioning pwl_out from high to low.

At time t3, nclk may de-assert by transitioning nclk from low to high. The de-assertion of nclk may signal the first delay signal dly1 to de-assert by transitioning dly1 high to low (FIG. 2). The de-assertion of nclk high may also signal clk_int to de-assert by transitioning clk_int from high to low. The de-assertion of clk_int may de-assert fb_1, lclk, and lclkb. The lclk may de-assert by transitioning lclk from high to low. The fb_1 and lclkb are de-asserted by transitioning them from low to high. The de-assertion of fb_1 may assert fb_2 by transitioning fb_2 from low to high. The delay through the delay inverters I24, I25, and I26 from nclk eventually may signal fb_2 to de-assert soon after fb_2 is asserted. Therefore, dly1 may signal fb_2 to de-assert by transitioning fb_2 from high to low. Unlike the slow nclk situation shown in FIG. 6, a fast nclk may de-assert clk_int before the pulse width limiting signal pwl_out signals clk_int. Therefore, clk_int, lclk, and lclkb may follow the falling and rising edge of nclk.

At time t4, lclk may be de-asserted by transitioning lclk from high to low (FIG. 4). The de-assertion of lclk may de-assert dly4 by transitioning dly4 from low to high. After the de-asserted dly4 signal propagates through the delay circuitry of the PWE circuit 115, dly4 may signal dly5 to de-assert by transitioning dly5 from low to high. The de-assertion of dly5 may signal pwe_out to de-assert. The pwe_out de-asserts by transitioning pwe_out from high to low.

At time t5, lclkb may be de-asserted by transitioning lclkb from low to high. The de-assertion of lclkb may signal dly2 of the PWL circuit 110 to de-assert by transitioning dly2 from high to low (FIG. 3). After dly2 de-asserts and propagates through the delay circuitry for PWL circuit 110, dly2 may signal dly3 to de-assert by transitioning dly3 from high to low. The dly2 may also signal pwl_out to de-assert by transitioning pwl_out from low to high.

At time t6, pwe_out may de-assert (FIG. 5). The de-assertion of pwe_out may signal to de-assert by transitioning EVAL from high to low. In the fast clock situation of FIG. 7, the pulse width of pwe_out may be wider than the pulse width of nclk. This may ensure that the evaluation signal EVAL of the local evaluation circuits have a wide enough pulse phase to read bitlines when there is a fast clock. During the slow clock situation, in reference to FIG. 6, the pulse width of the pwe_out circuit may have a smaller width than nclk. This may ensure that the EVAL has a pulse width less than the pulse width of the fast global clock so bitlines do no experience leakage when evaluated.

Figure 8:
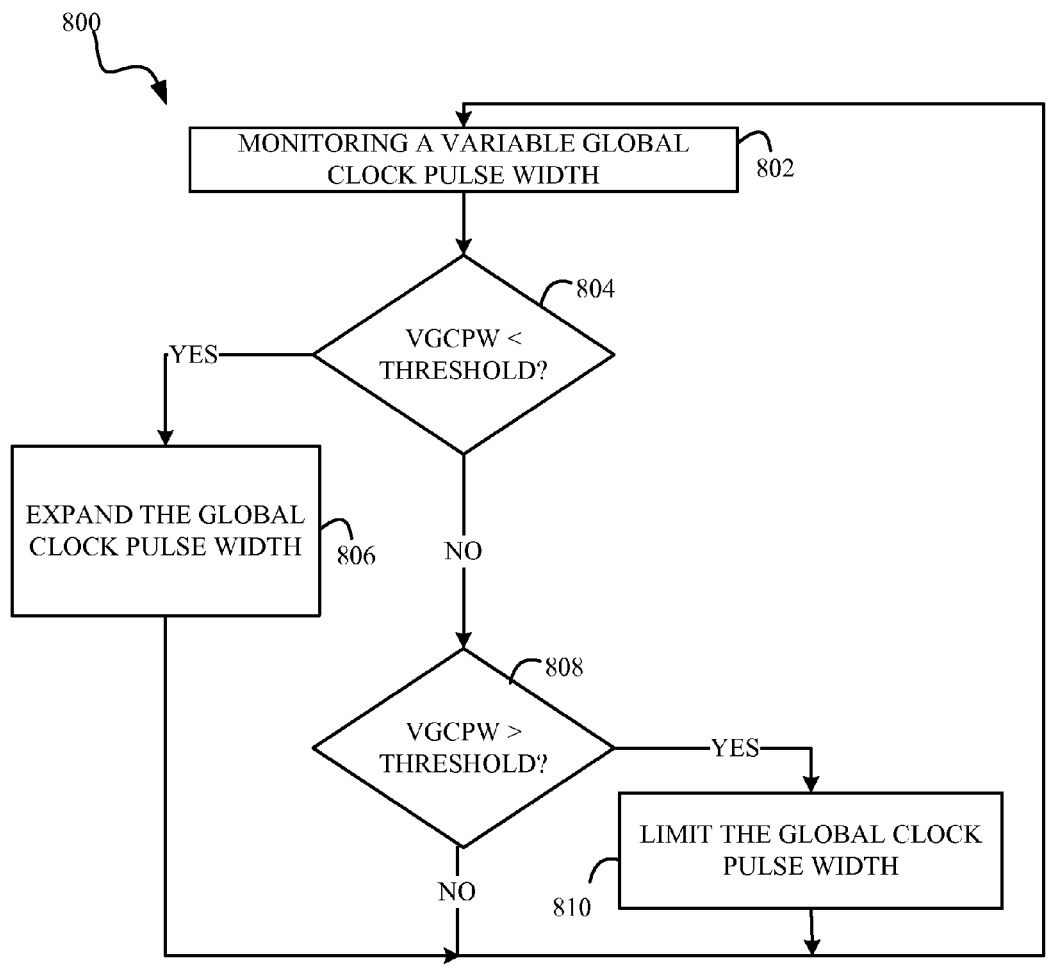
FIG. 8 is a block diagram of a method, according to an embodiment.

Referring now to FIG. 8, a method 800 is described for a clock system 100, according to an embodiment. In operation 802, the pulse width of a variable global clock signal nclk may be monitored. In operation 804, it may be determined whether the variable global clock signal nclk is faster, having a less pulse width, than a local evaluation pulse width threshold. The local evaluation signal pulse width threshold may be the acceptable pulse width range where an evaluation signal EVAL of a local evaluation circuit is signaled slow enough so that it has enough time to read a memory line, such as a bitline, but fast enough so that the memory line does not experience leakage, thus also giving a false reading. If nclk is fast, then the variable global clock signal pulse width may be expanded or increased to produce an expanded first local clock signal, as in operation 806 and the clock system 100 may return to operation 802 to continue monitoring the variable global clock signal.

If the variable global clock signal is not fast, then, in operation 808, it may be determined whether the global clock signal is slower, having a greater pulse width, than the local evaluation signal pulse width threshold. A slow clock signal may have a wide pulse width and may cause the local evaluation circuit of a memory array memory line, such as a bitline to inaccurately read a logical "0" instead of a logical "1" due to memory line leakage. If the variable global clock signal nclk is slow, then the variable global clock signal pulse width may be limited or decreased to produce a limited first local clock signal to increase the speed of the evaluation signal EVAL to the local evaluation circuits, in operation 810 and method 800 may return to monitoring the pulse width of the variable global clock signal nclk, in operation 802. If the variable global clock signal nclk is not slow in operation 808, then the method 800 may return to monitoring the pulse width of the variable global clock signal nclk, in operation 802.

While the Detailed Description may refer to specific types of transistors, logic gates, supply voltages, and the like it will be appreciated that one skilled in the art may implement same or similar functions using different transistors, logic gates, and supply voltages in alternative embodiments as described and still accomplish the same purpose of the invention. For example, transistors may be PFETs or NFETs. Logic gates may be AND, OR, XOR, NOR, NAND, XNOR or inverters. Therefore, the scope of the invention should not be limited.

Figure 9:
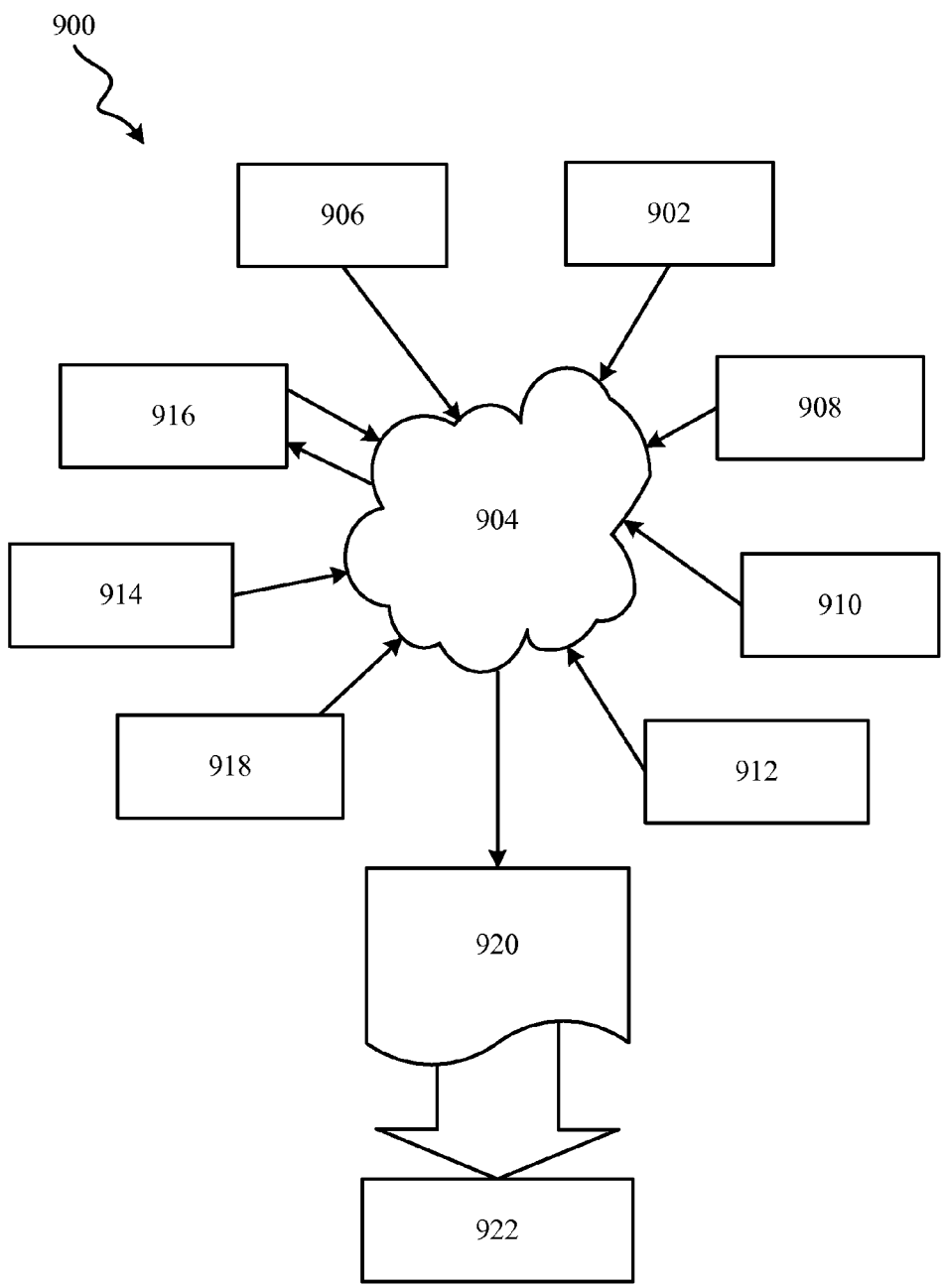
FIG. 9 is a flow diagram of a design process used in semiconductor design, manufacturing, and testing, according to an embodiment.

FIG. 9 shows a block diagram of an example design flow 900 that may be used for the clock system 100 described herein. Design flow 900 may vary depending on the type of integrated circuit (IC) being designed. For example, a design flow 900 for building an application specific IC (ASIC) may differ from a design flow 900 for designing a standard component. Design structure 902 is preferably an input to a design process 904 and may come from an IP provider, a core developer, or other design company or may be generated by the operator of the design flow, or from other sources. Design structure 902 comprises clock system 100, local clock buffer 105, PWL circuit 110, PWE circuit 115, or array timing circuit 500 in the form of schematics or HDL, a hardware-description language, for example, Verilog, VHDL, C, and the like. Design structure 902 is tangibly contained on, for example, one or more machine readable storage medium. For example, design structure 902 may be a text file or a graphical representation of clock system 100, local clock buffer 105, PWL circuit 110, PWE circuit 115, or array timing circuit 500. Design process 904 preferably synthesizes, or translates, clock system 100, local clock buffer 105, PWL circuit 110, PWE circuit 115, or array timing circuit 500 into a netlist 906, where netlist 906 is, for example, a list of wires, transistors, logic gates, control circuits, I/O, models, etc. that describes the connections to other elements and circuits in an integrated circuit design and recorded on at least one of machine readable storage medium. This may be an iterative process in which netlist 906 is resynthesized one or more times depending on design specifications and parameters for the circuit.

Design process 904 may include using a variety of inputs; for example, inputs from library elements 908 which may house a set of commonly used elements, circuits, and devices, including models, layouts, and symbolic representations, for a given manufacturing technology, such as different technology nodes, 32 nm, 45 nm, 90 nm, and the like, design specifications 910, characterization data 912, verification data 914, design rules 916, and test data files 918, which may include test patterns and other testing information. Design process 904 may further include, for example, standard circuit design processes such as timing analysis, verification, design rule checking, place and route operations, and the like. One of ordinary skill in the art of integrated circuit design can appreciate the extent of possible electronic design automation tools and applications used in design process 904 without deviating from the scope and spirit of the invention. The design structure of the invention is not limited to any specific design flow.

Design process 904 preferably translates an embodiment of the invention as shown in FIGS. 1-8 along with any additional integrated circuit design or data (if applicable), into a second design structure 920. Design structure 920 resides on a machine readable storage medium in a data format used for the exchange of layout data of integrated circuits, for example, information stored in a GDSII (GDS2), GL1, OASIS, or any other suitable format for storing such design structures. Design structure 920 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1-8. Design structure 920 may then proceed to a stage 922 where, for example, design structure 920 proceeds to tape-out, is released to manufacturing, is released to a mask house, is sent to another design house, is sent back to the customer, and the like.

While the present invention has been described with reference to the details of the embodiments of the invention shown in the drawings, these details are not intended to limit the scope of the invention as claimed in the appended claims.

What is claimed is:

1. A method comprising:
monitoring a variable global clock signal pulse width;
determining whether the variable global clock signal pulse width is within a local evaluation signal pulse width threshold;
adjusting the variable global clock signal pulse width to be within the local evaluation signal pulse width threshold if the variable global clock signal pulse width is not within the local evaluation signal pulse width threshold; and
producing a first local clock signal from the variable global clock signal by a local clock buffer adapted to receive a variable global clock signal;
limiting the first local clock signal pulse width with a pulse width logic control circuit in operable communication with the local clock buffer to be less than the variable global clock signal pulse width during a slow mode; and
expanding the first local clock signal pulse width with the pulse width logic control circuit to be greater than the variable global clock signal pulse width during a fast mode, wherein the limited and expanded first local clock signals may signal a local evaluation circuit to address a memory line.

2. The method of claim 1, wherein limiting the first local clock signal pulse width includes a pulse width limiting circuit, within the pulse width logic control circuit, in operable communication with the local clock buffer, the pulse width limiting circuit limiting the first local clock signal pulse width, during the slow mode, creating a limited local clock signal, wherein the limited local clock signal pulse width is less than the variable global clock signal pulse width during the slow mode.

3. The method of claim 1, wherein expanding the first local clock signal pulse width includes a pulse width expansion circuit, within the pulse width logic control circuit, in operable communication with the local clock buffer, the pulse width expansion circuit expanding the first local clock signal, during the fast mode, creating an expanded pulse width signal, wherein the expanded pulse width signal pulse width is greater than the variable global clock signal pulse width during fast mode.

4. The method of claim 1, wherein the variable global clock signal has fast mode and slow mode.

5. The method of claim 4, wherein the fast mode variable global clock signal has a pulse width that is less than a local evaluation signal pulse width threshold and the slow mode variable global clock signal has a pulse width that is greater than a local evaluation signal pulse width threshold.

6. A design structure tangibly embodied in a machine readable medium used in a design process,
the design structure comprising:
a clock system including;
a local clock buffer adapted to receive a variable global clock signal, wherein the local clock buffer produces a first local clock signal from the variable global clock signal; and
a pulse width logic control circuit in operable communication with the local clock buffer, the pulse width logic control circuit adapted to limit the first local clock signal pulse width to be less than the variable global clock signal pulse width during a slow mode and the pulse width logic control circuit adapted to expand the first local clock signal pulse width to be greater than the variable global clock signal pulse width during a fast mode, wherein the limited and expanded first local clock signals may signal a local evaluation circuit to address a memory line.

7. The design structure of claim 6, wherein the pulse width logic control circuit includes a pulse width limiting circuit in operable communication with the local clock buffer, the pulse width limiting circuit limiting the first local clock signal pulse width, during a slow mode, creating a limited local clock signal, wherein the limited local clock signal pulse width is less than the variable global clock signal pulse width during the slow mode.

8. The design structure of claim 6, wherein the pulse width logic control circuit includes a pulse width expansion circuit in operable communication with the local clock buffer, the pulse width expansion circuit expanding the first local clock signal, during a fast mode, creating an expanded pulse width signal, wherein the expanded pulse width signal pulse width is greater than the variable global clock signal pulse width during fast mode.

9. The design structure of claim 8, wherein the pulse width expansion circuit expands the first local clock signal, during the slow mode, creating an expanded pulse width signal, wherein the expanded pulse width signal pulse width is less than the pulse width of the variable global clock sign during slow mode.

10. The design structure of claim 6, wherein the variable global clock signal has a fast mode and a slow mode.

11. The design structure of claim 10, wherein the fast mode variable global clock signal has a pulse width that is less than a local evaluation signal pulse width threshold.

12. The design structure of claim 10, wherein the slow mode variable global clock signal has a pulse width that is greater than a local evaluation signal pulse width threshold.

13. A clock system comprising:
a local clock buffer adapted to receive a variable global clock signal, wherein the local clock buffer produces a first local clock signal from the variable global clock signal; and
a pulse width logic control circuit in operable communication with the local clock buffer, the pulse width logic control circuit adapted to limit the first local clock signal pulse width to be less than the variable global clock signal pulse width during a slow mode and the pulse width logic control circuit adapted to expand the first local clock signal pulse width to be greater than the variable global clock signal pulse width during a fast mode, wherein the limited and expanded first local clock signals may signal a local evaluation circuit to address a memory line.

14. The clock system of claim 13, wherein the pulse width logic control circuit includes a pulse width limiting circuit in operable communication with the local clock buffer, the pulse width limiting circuit limiting the first local clock signal pulse width, during a slow mode, creating a limited local clock signal, wherein the limited local clock signal pulse width is less than the variable global clock signal pulse width during the slow mode.

15. The clock system of claim 13, wherein the pulse width logic control circuit includes a pulse width expansion circuit in operable communication with the local clock buffer, the pulse width expansion circuit expanding the first local clock signal, during a fast mode, creating an expanded pulse width signal, wherein the expanded pulse width signal pulse width is greater than the variable global clock signal pulse width during fast mode.

16. The clock system of claim 15, wherein the pulse width expansion circuit expands the first local clock signal, during the slow mode, creating an expanded pulse width signal, wherein the expanded pulse width signal pulse width is less than the pulse width of the variable global clock sign during slow mode.

17. The clock system of claim 13, wherein the variable global clock signal has a fast mode and a slow mode.

18. The clock system of claim 17, wherein the fast mode variable global clock signal has a pulse width that is less than a local evaluation signal pulse width threshold.

19. The clock system of claim 17, wherein the slow mode variable global clock signal has a pulse width that is greater than a local evaluation signal pulse width threshold.

* * * * *